US008405095B2

(12) United States Patent
Youn

(10) Patent No.: US 8,405,095 B2
(45) Date of Patent: Mar. 26, 2013

(54) LIGHT-EMITTING DEVICE AND METHOD FOR MANUFACTURING THE SAME

(75) Inventor: Jang Kee Youn, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 188 days.

(21) Appl. No.: 12/871,397

(22) Filed: Aug. 30, 2010

(65) Prior Publication Data

US 2011/0108867 A1 May 12, 2011

(30) Foreign Application Priority Data

Nov. 12, 2009 (KR) .................... 10-2009-0109369

(51) Int. Cl.
*H01L 27/15* (2006.01)

(52) U.S. Cl. ............... 257/79; 257/95; 257/E21.352; 438/26; 438/27; 438/28; 438/29; 438/31

(58) Field of Classification Search .............. None
See application file for complete search history.

(56) References Cited

U.S. PATENT DOCUMENTS

| | | | | |
|---|---|---|---|---|
| 2004/0222435 | A1* | 11/2004 | Shimizu et al. | 257/100 |
| 2006/0284195 | A1* | 12/2006 | Nagai | 257/98 |
| 2008/0164577 | A1* | 7/2008 | Li et al. | 257/627 |
| 2010/0072881 | A1* | 3/2010 | Sakuma et al. | 313/503 |
| 2010/0207511 | A1* | 8/2010 | Harada | 313/501 |

FOREIGN PATENT DOCUMENTS

| | | |
|---|---|---|
| JP | 2002-353507 | 12/2002 |
| JP | 2003-243726 A | 8/2003 |
| JP | 2005-060557 | 3/2005 |
| JP | 2005-271198 | 10/2005 |
| JP | 2007-059418 | 3/2007 |
| JP | 2008-143978 | 6/2008 |
| JP | 2009-200172 | 9/2009 |
| JP | 2009-260053 | 11/2009 |
| KR | 10-2008-0070414 | 7/2008 |
| KR | 10-2009-0065052 | 6/2009 |

\* cited by examiner

*Primary Examiner* — Fei Fei Yeung Lopez
(74) *Attorney, Agent, or Firm* — McKenna Long & Aldridge LLP

(57) ABSTRACT

The embodiment is to provide a light emitting device and a method for manufacturing the same, in which the light emitting device includes a first conductive semiconductor layer; an active layer formed on the first conductive semiconductor layer; a second conductive semiconductor layer formed on the active layer; and a phosphor layer formed on the second conductive semiconductor layer; in which the phosphor layer includes a phosphor receiving member including a plurality of cavities and phosphor particles fixed in the cavities.

25 Claims, 4 Drawing Sheets

LIGHT-EMITTING DEVICE AND METHOD FOR MANUFACTURING THE SAME

The present application claims priority under 35 U.S.C. §119 to Korean Patent Application No. 10-2009-0109369, filed on Nov. 12, 2009, the entirety of which is hereby incorporated by reference.

BACKGROUND OF THE INVENTION

1. Field of the Invention

The embodiment relates to a light emitting device and a method for manufacturing the same.

2. Description of the Related Art

A light-emitting device (LED) is a semiconductor light-emitting device that transforms current into a light. Recently, the use of the light-emitting device has been increasing as a source of light for display, a source of light for automobile and a source of light for lighting due to gradually increasing of a luminance of LED.

Recently, a high power light-emitting chip available for implementing full colors by producing a short wavelength light, such as blue or green has been developed. To this end, the light-emitting diode having various colors can be effective in combinations, and a light-emitting diode emitting a white light can be implemented by absorbing a part of light outputted from the light-emitting chip and applying a phosphor outputting different wavelengths with the wavelengths of light on the light-emitting chip.

SUMMARY OF THE INVENTION

The embodiment is to provide a light-emitting device and a method for manufacturing the same that can easily and precisely control a distribution position and distribution degree of a phosphor on the light-emitting device and prevents a waste of the phosphor materials upon processing.

According to one aspect of the embodiment, there is provided a light-emitting device and a method for manufacturing the same that can improve light efficiency on a surface of the light-emitting device chip, and can remove air layer obstructing a total reflection.

A light-emitting device according to an exemplary embodiment of the present invention includes: a first conductive semiconductor layer; an active layer formed on the first conductive semiconductor layer; a second conductive semiconductor layer formed on the active layer; and a phosphor layer formed on the second conductive semiconductor layer, in which the phosphor layer includes a phosphor receiving member having a plurality of cavities and phosphor particles fixed in the cavities.

A method for manufacturing the light-emitting device according to another exemplary embodiment of the present invention includes: forming the first conductive semiconductor layer on the substrate; forming the active layer on the first conductive semiconductor layer; forming the second conductive semiconductor layer on the active layer; forming the phosphor receiving member having the plurality of the cavities on the second conductive semiconductor layer; and the phosphor layer by fixing the phosphor particles on the plurality of the cavities of the phosphor receiving member.

According to the embodiments, there is provided the light-emitting device and the method for manufacturing the same that can easily and precisely control the distribution position and distribution degree of the phosphor on the light-emitting device and prevents a waste of the phosphor materials upon processing.

In addition, according to one aspect of the embodiment, there is provided the light-emitting device and the method for manufacturing the same that has the improved light efficiency on the surface of the light-emitting device chip, and can be removed with air layer obstructing the total reflection.

DETAILED DESCRIPTION OF EMBODIMENTS

Figure 1:
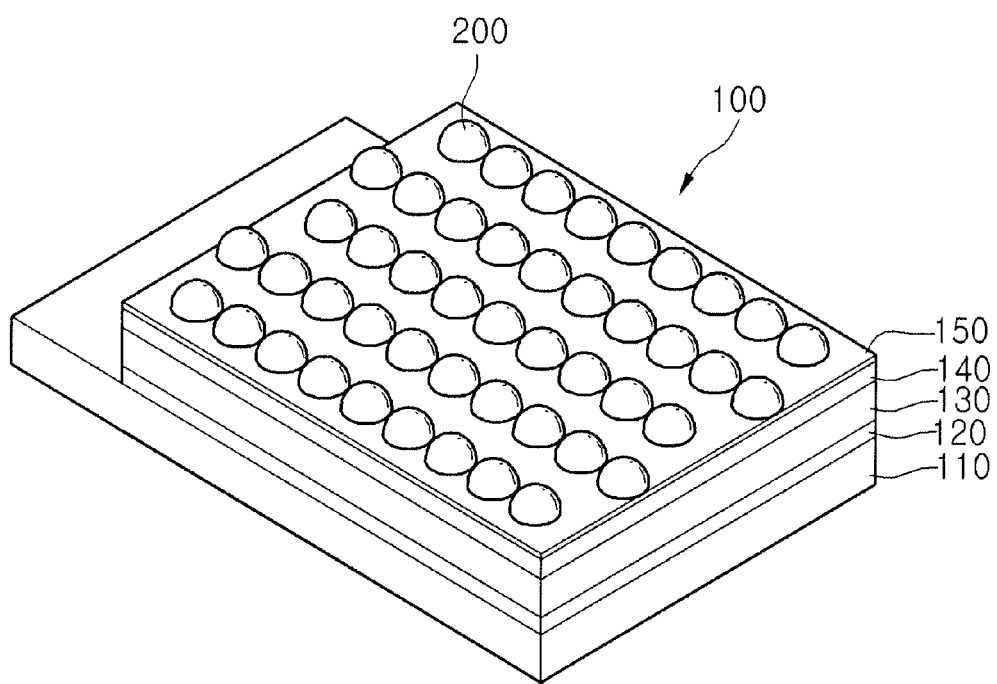
FIG. 1 is a perspective diagram showing a light-emitting device according to an embodiment of the present invention.

Hereinafter, the light-emitting device and the method for manufacturing the same according to the embodiments will be described in detail with reference to the appended drawings. For the description of the embodiments, in the case of describing as forming each layer (film), portions, patterns or structures "on" or "under" substrates, each layer (film), portions, pads or patterns, "on" or "under" includes all of "directly" or "indirectly" formed things. In addition, a standard about "on" or "under" each layer will be described based on the drawings. In the drawings, a thickness or size of each layer is shown roughly, exaggeratedly, or briefly for convenience sake of the description or for a definite description. In addition, a size of each element does not reflect entirely real size.

FIG. 1 is a perspective diagram illustrating a light-emitting device according to an embodiment of the present invention.

As shown in FIG. 1, a light-emitting device 100 includes a substrate 110, a first conductive semiconductor layer 120 formed on the substrate 110; a active layer 130 formed on the first conductive semiconductor layer 120; a second conductive semiconductor layer 140 formed on the active layer 130; and a phosphor layer 150 formed on the second conductive semiconductor layer 140.

The substrate 110 may comprise at least one of Al2O3, SiC, Si, GaAs, GaN, ZnO, GaP, InP and Ge, and may have a conductive property. In addition, the substrate 110 can be also applicable to a vertical chip by removing the substrate after Epi growth. In this case, Physical Grinding, Laser Lift Off (LLO), Chemical Wet Etching, and the like can remove the substrate.

The first conductive semiconductor layer 120 can be an n-type semiconductor layer having at least one layer doped with a first conductive dopant. The first conductive semiconductor layer 120 can be formed with at least one of GaN, InN, AlN, InGaN, AlGaN, InAlGaN, AlInN, AlGaAs, InGaAs, AlInGaAs, GaP, AlGaP, InGaP, AlInGaP, and InP. When setting the first conductive semiconductor layer 120 as an electron injection layer, the first conductive dopant may include n-type dopant such as Si, Ge, Sn, Se, Te. The first conductive dopant may function as the electrode contact layer hereafter.

The active layer 130 is formed as a single quantum well or multi quantum well (MQW) structure on the first conductive semiconductor layer 120. The active layer 130 can emit a chromatic light (for example: blue, green, red, etc) or an ultraviolet light. The active layer 130 may be formed by InGaN/GaN, AlGaN/GaN, or InAlGaN/GaN, GaAs/AlGaAs (InGaAs), GaP/AlGaP(InGaP), and the like, and can adjust a wavelengths of light emitted according to a band gap energy of a material that forms a well layer or barrier layer. For example, in the case of a blue light-emitting of 460~470 nm wavelengths, InGaN well layer/GaN barrier layer can be formed as one period.

The second conductive semiconductor layer 140 can be implemented as p-type semiconductor doped with the second conductive dopant on the active layer 130. The second conductive semiconductor layer 140 may include any one of compound semiconductors, such as GaN, InN, AlN, InGaN, AlGaN, InAlGaN, AlInN, AlGaAs, InGaAs, AlInGaAs, GaP, AlGaP, InGaP, AlInGaP, InP, and the like. P-type dopant such as Mg, Zn, Ca, Sr, Ba, etc. can be added to the second conductive semiconductor layer 140.

The phosphor layer 150 can be formed on the second conductive semiconductor layer 140. The phosphor layer 150 can be formed as an uniformly distributed and fixed phosphor that is a particle. The phosphor layer 150 includes the phosphor receiving member 152 that has the plurality of cavities 155 for fixing of the phosphor and the phosphor particles 200 fixed in the cavities 155.

The phosphor particles 200 have a corresponding shape to the cavities 155 shape, and may be injected and fixed in the cavities 155 of the phosphor receiving member 152, thereby forming the phosphor layer 150. Therefore, the phosphor can be distributed uniformly, and the light-emitting efficiency can be improved by forming a photonic crystal type when forming the cavities 155. In addition, by forming the phosphor layer 150 to be overlapped in the light-emitting portion of the second conductive semiconductor layer 140, there is an effect that an air layer having a different refractive index is removed, and the total reflection can be reduced, so that a color distribution can be narrowed. According to the embodiments of the present invention, the light emitted from the active layer 130 emits to outside through the second conductive semiconductor layer 140 and the phosphor layer 150. Therefore, the light emitted from the active layer 130 can be converted to a light having a different wavelengths in the phosphor layer, and emit as the chromatic light or white light type having fixed colors, so that a light extraction efficiency can be improved by the photonic crystal shape of the phosphor layer 150.

Meanwhile, the description as mentioned above illustrates when positioning the active layer 130 having the quantum well between the first conductive semiconductor layer 120 formed as a n-type GaN that is basically made of GaN based material and the electron injection layer and the second conductive semiconductor layer 140 formed as a p-type GaN that is a hole injection layer. However the order of layers can be changed by forming the first conductive semiconductor layer as the p-type semiconductor and the second conductive semiconductor layer as the n-type semiconductor.

Figure 2:
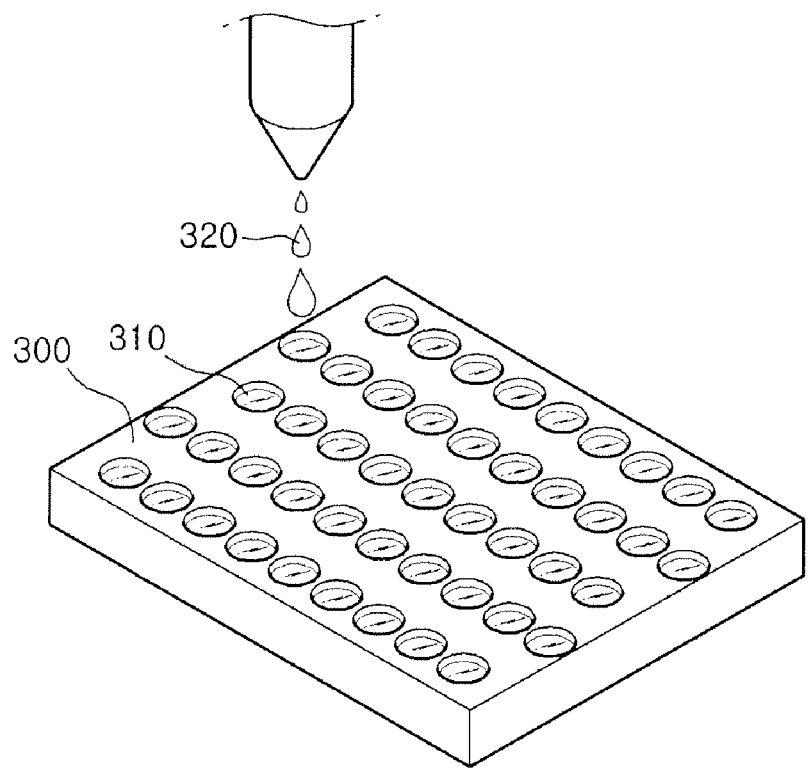
FIG. 2 to FIG. 4 are diagrams of manufacturing a light-emitting device according to an embodiment of the present invention.
Figure 3:
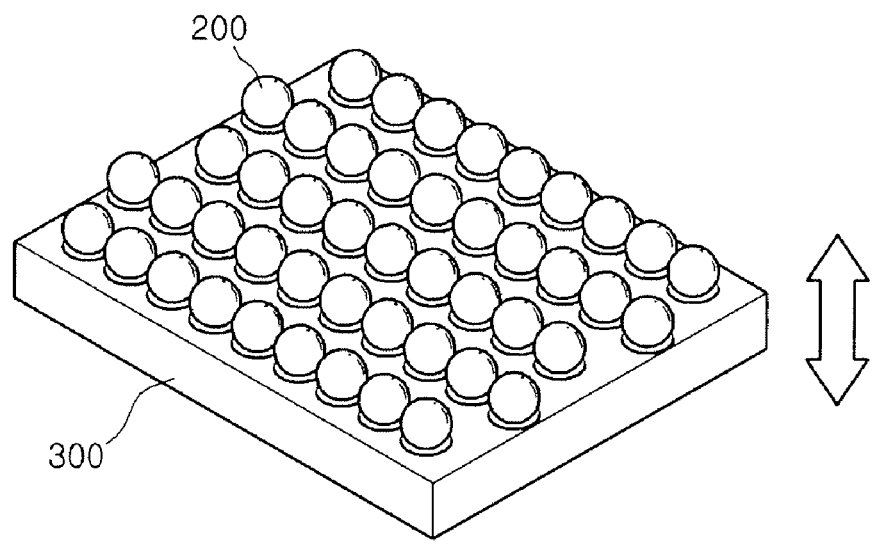
Figure 4:
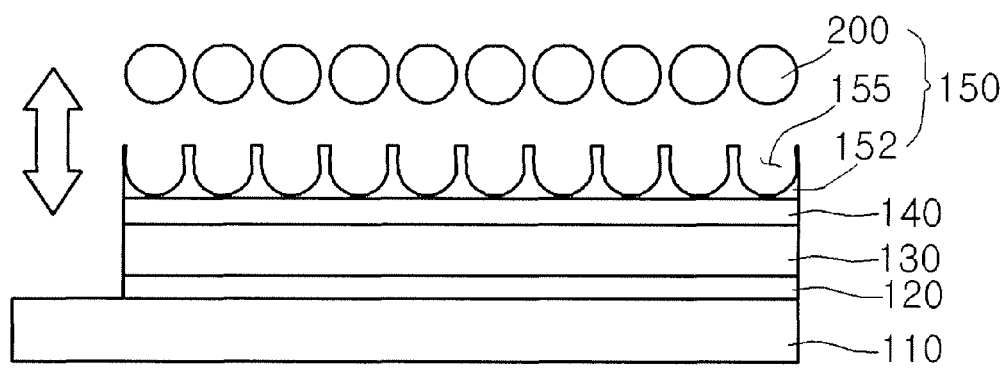

FIG. 2 to FIG. 4 are diagrams to illustrate manufacturing the light-emitting device according to the embodiments of the present invention, and illustrate manufacturing the phosphor layer 150.

As shown in FIG. 2, a mixed liquid of the phosphor 320 is injected in a mold which resembles the shape of the phosphor particles 200 in order to form the phosphor particles 200.

A shape of the phosphor particles 200 in the mold 300 is a concave portion 310, so that the mold receives the mixed liquid of the phosphor 320. The concave portion 310 can be formed as a spherical like shape, a polygonal shape, a conical shape, a truncated pyramidal shape, a rectangular shape, and a cylindrical shape, etc. according to the shape of the phosphor particles 200 to be formed. In addition, the concave portion 310 can be formed as a various size from several um to at least 1 mm size according to the size of the phosphor particles 200. In this case, the mold 300 can be possible to be configured a type to complete the phosphor particles 200 shapes by matching each other according to the shape of the phosphor particles 200.

The mixed liquid of the phosphor 320 can be made by mixing the phosphor and resin. Various species of R. G. B. phosphor, such as silicate series, sulfide series, garnet series, nitride series, yttrium, aluminum, etc. can be selectively applied to the mixed phosphor. The resin forming the mixed liquid of the phosphor is a material available to be mixed or harden can employ various materials, such as silicone or a transparent epoxy resin, etc. The fixed solvent can be added to the mixed liquid of the phosphor and resin in order to control a viscosity.

FIG. 3 illustrates separating of the phosphor particles 200.

The phosphor particles 200 according to the concave shape are formed by charging the mixed liquid of the phosphor 320 to the concave portion 310 of the mold 300, and then hardening, The phosphor particles 200 having a regular shape can be achieved by separating the hardened phosphor particles 200 from the mold 300. Therefore, a leaking or hardening of the phosphor before use can be prevented by forming the phosphor particles 200 by preparing the mixed liquid of the phosphor 320 merely when it is needed and charging it to the concave portion 310.

FIG. 4 illustrates a method for manufacturing the phosphor layer 150 of the light-emitting device.

The phosphor receiving member 152 having the plurality of the cavities for fixing the phosphor particles 200 is formed on the second conductive semiconductor layer 140. The phosphor layer 150 is formed on the second conductive semiconductor layer 140 by applying the phosphor particles 200 in the phosphor receiving member 152 having the cavities 155 and hardening. The phosphor particles 200 received in the cavities 155 can be fixed by using the resin, or can be fixed through the hardening process. In this case, the phosphor particles 200 remained after being received in the cavities 155 among the phosphor particles 200 applied in the phosphor receiving member 152 can be reused, so that the waste of the phosphor materials can be prevented.

The cavities 155 formed in the phosphor receiving member 152 can be employed with Reactive Ion Etching (RIE) by using a photo resistor, Nano Imprinting, Tape Adhesive way, etc. In this case, the shape of the cavities 155 can be formed to match with the shape of the phosphor particles 200, and the light-emitting properties of the light-emitting device can be adjusted by controlling the arrangement way, arrangement distance, and the like. The phosphor particles 200 are received in the cavities 155 by applying the phosphor particles 200 in the phosphor receiving member 152 having the cavities 155. The light can be distributed uniformly by inserting one of the e phosphor particles 200 in each of cavities 155. However, it may also be possible that one cavity receives more that one phosphor particle 200 according to the cavities 155 and the sizes or shapes of the phosphor particles 200.

Figure 5:
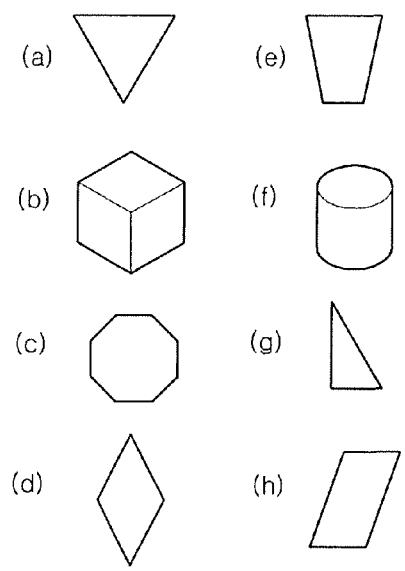
FIGS. 5A to 5H are an exemplary diagram illustrating the phosphor particles of the light-emitting device according to the embodiments of the embodiment.

FIG. 5 is an exemplary diagram illustrating the phosphor particles of the light-emitting device according to the embodiments of the present invention.

A chromaticity, light-emitting properties, light efficiency of the light-emitting device 100 can be adjusted by varying the size and shape of the phosphor particles 200. Therefore, the phosphor particles 200 having various sizes and shapes can be applied according to the properties of the applied phosphor, a design requirement of the light-emitting device 100, and the like.

FIG. 5A illustrates the phosphor particles, in which its cross-section is an equilateral triangle, FIG. 5B illustrates the phosphor having a regular hexahedron shape. FIG. 5C illustrates the phosphor particles, in which its cross-section is an octahedron, and FIG. 5D illustrates the phosphor particles, in which its cross-section is a rhombohedral shape. FIG. 5E illustrates the phosphor particles, in which its cross-section is a trapezoidal, and FIG. 5F illustrates the phosphor particles, in which its cross-section is a cylindrical. FIG. 5G illustrates the phosphor particles, in which its cross-section is a right-angled triangle, and FIG. 5H illustrates the phosphor particles, in which its cross-section is a parallelogram.

As shown in FIGS. 5A to 5H, the phosphor particles can be formed as various polygonal shapes, such as a polyhedron, horn, column, etc, and will not be limited thereto, can employ the phosphor particles having various shapes, such as regular truncated pyramid shape, spherical shape, and the like.

Figure 6:
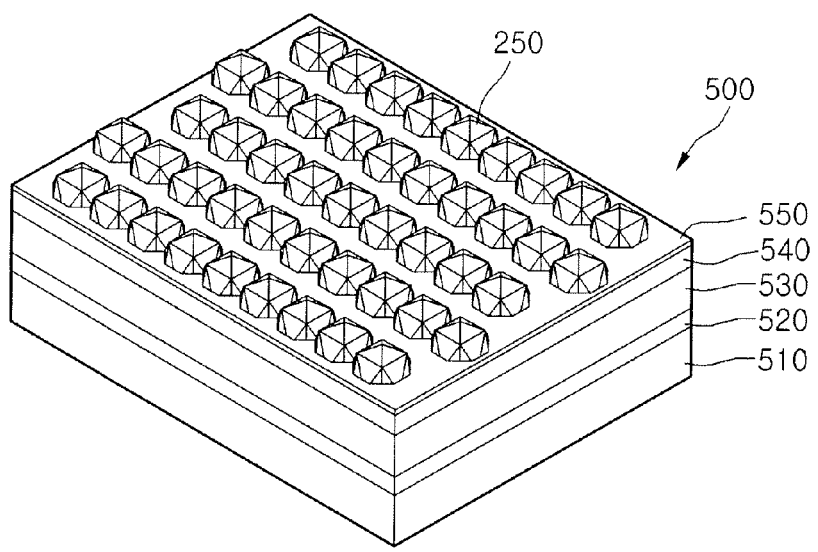
FIG. 6 is a perspective view showing a light-emitting device according to other embodiment of the present invention.

FIG. 6 is a perspective view illustrating the light-emitting device according to another embodiment of the present invention.

The light-emitting device includes a metal layer 510, the first conductive semiconductor layer 520 formed on the metal layer 510, the active layer 530 formed on the first conductive semiconductor layer 520, the second conductive semiconductor layer 540 formed on the active layer 530, and the phosphor layer 550 formed on the second conductive semiconductor layer 540.

The metal layer 510 can be made of at least one of Al, Ag, Pd, Rh, Pt, and the like, and alloys thereof.

The first conductive semiconductor layer 520 can be implemented as the p-type semiconductor layer doped with the first conductive dopant on the metal layer 510. The second conductive semiconductor layer 540 can be made of any one of compound semiconductors, such as GaN, InN, AlN, InGaN, AlGaN, InAlGaN, AlInN, AlGaAs, InGaAs, AlInGaAs, GaP, AlGaP, InGaP, AlInGaP, InP, and the like.

The second conductive dopant may include p-type dopant such as Mg, Zn, Ca, Sr, Ba, and the like.

The active layer 530 is formed as the single quantum well or multi quantum well (MQW) structure on the first conductive semiconductor layer 520. The active layer 530 can emit the chromatic light (for example: blue, green, red, etc) or the ultraviolet light. Forming the active layer 530 can be available to use InGaN/GaN, AlGaN/GaN, or InAlGaN/GaN, GaAs/AlGaAs (InGaAs), GaP/AlGaP(InGaP), and the like, and can adjust the wavelengths of light emitted according to the band gap energy of the material that forms the well layer or barrier layer. For example, in the case of the blue light-emitting of 460~470 nm wavelengths, InGaN well layer/GaN barrier layer can be formed as one period.

The second conductive semiconductor layer 540 can be implemented as the n-type semiconductor doped with the second conductive dopant on the active layer 530. The first conductive semiconductor layer 520 can be made of any one of compound semiconductors, such as GaN, InN, AlN, InGaN, AlGaN, InAlGaN, AlInN, AlGaAs, InGaAs, AlInGaAs, GaP, AlGaP, InGaP, AlInGaP, InP, and the like.

When setting the first conductive semiconductor layer 120 as an electron injection layer, the first conductive dopant may include n-type dopant such as Si, Ge, Sn, Se, Te.

The phosphor layer 550 can be formed on the second conductive semiconductor layer 540.

The phosphor layer 550 can be formed as an uniformly distributed and fixed phosphor that is a particle. The plurality of the cavities 555 is formed on the second conductive semiconductor layer 540 for fixing the phosphor. The phosphor particles 250 have a shape corresponding to the shape of the cavities 555, and form the phosphor layer 550 by inserting and fixing in the cavities 555.

Figure 7:
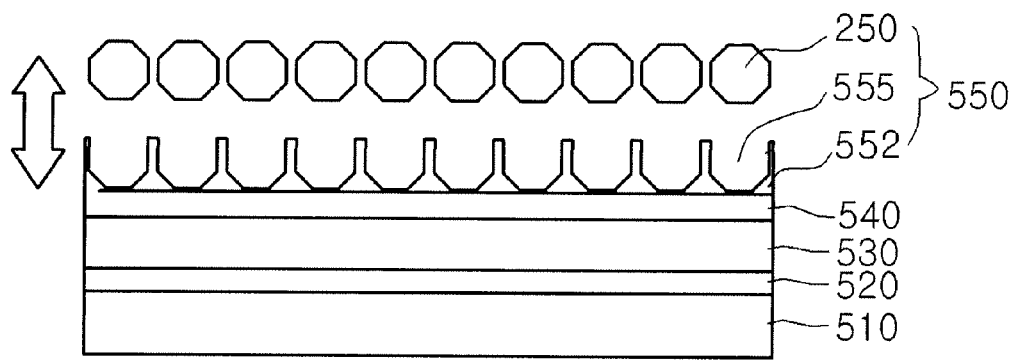
FIG. 7 is a diagram for manufacturing the light-emitting device according to other embodiments of the present invention.

FIG. 7 is a phase diagram for manufacturing the light-emitting device 500 according to other embodiment of the present invention, and illustrates a formation phase of the phosphor layer 550 of FIG. 6.

As shown in FIG. 7, the phosphor receiving member 552 having the plurality of the cavities 555 in which its cross-section is an octagon is formed on the second conductive semiconductor layer 540. The cavities 555 having the octagon cross-section can be formed at a uniform distance from one another by employing Reactive Ion Etching, Wet Etching, Nano Imprinting, and the like.

The phosphor particles 250 are polyhedron particles having the octagon cross-section, and can be provided as the hardened type of the resin and the phosphor.

Each cavity 555 receives the phosphor particles 250 by applying the phosphor particles 250 to the phosphor receiving member 552 having the cavities 555. In this case, the remained phosphor particles that are not received in the cavities can be collected and can be re-used.

When inserting the phosphor particles 250 to the cavities 555, the phosphor layer 550 can be formed on the second conductive semiconductor layer 540 by fixing using the resin or hardening itself.

According to the embodiments as mentioned above, size and arrangement distance of the phosphor particles can be controlled, so that the chromaticity can be easily and precisely adjusted, and the chromatic distribution can be narrowed. In addition, the waste of the phosphor material upon processing can be prevented by employing as the shape of the phosphor particles 250 of the phosphor. And the light-emitting efficiency can be improved by forming a photonic crystal type when forming the cavities 155.

Features, structures, effect, and the like as mentioned in the embodiment as mentioned above are included in at least one embodiment of the present invention, and will not be limited thereto. In addition, Features, structures, effect, and the like as illustrated in each embodiment of the present invention can be combined and modified by those skilled in the prior arts field. Therefore, it should be understood that the contents related to the combinations and modifications are included in the scope of the present invention.

In addition, the embodiments were described as mentioned above, but they are only examples, and cannot be limited thereto. If the person have skills about the prior art field, they can modify and be applicable within the essential scope of the present invention. For example, each element that is described in the embodiments can be modified and be performed. And it should be understood that the difference related to the modifications and the applications is included in the scope of the present invention as defined in the appended claims.

What is claimed is:

1. A light-emitting device comprising: a first conductive semiconductor layer; an active layer formed on the first conductive semiconductor layer; a second conductive semiconductor layer formed on the active layer; and a phosphor layer formed on the second conductive semiconductor layer, wherein the phosphor layer includes a phosphor receiving member with a plurality of cavities and a plurality of phosphor particles, and wherein each of the plurality of phosphor particles is positioned in a corresponding one of the plurality of cavities, and wherein the phosphor particles have a shape corresponding to the shape of the cavities, and wherein the phosphor particles protrude out of the cavities.

2. The light-emitting device according to claim 1, wherein the phosphor layer is formed directly on the second conductive semiconductor layer.

3. The light-emitting device according to claim 1, wherein each of the plurality of phosphor particles is fixed in a corresponding one of the plurality of cavities.

4. The light-emitting device according to claim 3, wherein the plurality of phosphor particles is covered with a resin material.

5. The light-emitting device according to claim 1, wherein each of the plurality of cavities and each of the plurality of phosphor particles are spherical in shape.

6. The light-emitting device according to claim 1, wherein the plurality of cavities is positioned a uniform distance apart from one another.

7. The light-emitting device according to claim 1, wherein the width of each of the plurality of cavities is greater than 10 um.

8. The light-emitting device according to claim 1, wherein each of the plurality of phosphor particles and each of the plurality of cavities are formed in one of a spherical like shape, a polygonal shape, a conical shape, a truncated pyramidal shape, a rectangular shape, and a cylindrical shape.

9. The light-emitting device according to claim 1, wherein the plurality of phosphor particles includes a phosphor material and a resin.

10. The light-emitting device according to claim 9, wherein the phosphor material includes at least one of a red phosphor, a green phosphor, a blue phosphor, and a white phosphor.

11. The light-emitting device according to claim 9, wherein the resin includes at least one of silicon and epoxy resin.

12. A method of manufacturing a light-emitting device comprising:
    forming a first conductive semiconductor layer on a substrate;
    forming an active layer on the first conductive semiconductor layer;
    forming a second conductive semiconductor layer on the active layer; and
    forming a phosphor layer on the second conductive semiconductor layer, wherein the phosphor layer includes a plurality of cavities and a plurality of phosphor particles, and
    wherein each of the plurality of phosphor particles is positioned in a corresponding one of the plurality of cavities, and wherein forming the plurality of phosphor particles comprises:
        mixing phosphor and resin;
        injecting the phosphor and resin mixture in a mold to form the plurality of phosphor particles each having a desired shape;
        allowing the phosphor and resin mixture in the mold to harden; and
        separating the hardened phosphor particles from the mold.

13. The method of manufacturing the light-emitting device according to claim 12, wherein forming the phosphor layer comprises:
    forming the phosphor layer directly on the second conductive semiconductor layer.

14. The method of manufacturing the light-emitting device according to claim 12, wherein forming the phosphor layer comprises:
    fixing each of the plurality of phosphor particles in a corresponding one of the plurality of cavities.

15. The method of manufacturing the light-emitting device according to claim 14, wherein forming the phosphor layer further comprises:
    covering the plurality of phosphor particles with a resin material.

16. The method of manufacturing the light-emitting device according to claim 12, wherein forming the phosphor layer comprises:
    forming the plurality of cavities using at least one of Reactive Ion Etching (RIE), Wet Etching, Nano Imprinting, and Tape adhesive way.

17. The method of manufacturing the light-emitting device according to claim 12, wherein forming the phosphor layer comprises:
    forming each of the plurality of cavities in at least one of a spherical shape, a polygonal shape, a conical shape, a truncated pyramidal shape, and a cylindrical shape.

18. The method of manufacturing the light-emitting device according to claim 12, wherein forming the phosphor layer comprises:
    forming the plurality of cavities a uniform distance apart from one another.

19. The method of manufacturing the light-emitting device according to claim 12, wherein forming the phosphor layer comprises:
    forming the plurality of cavities such that each has a width of at least 10 um.

20. The method of manufacturing the light-emitting device according to claim 12, wherein forming the phosphor layer comprises:
    forming each of the plurality of phosphor particles in at least one of a spherical shape, a polygonal shape, a conical shape, a truncated pyramidal shape, and a cylindrical shape, in accordance with the shape of a corresponding one of the plurality of cavities.

21. The method of manufacturing the light-emitting device according to claim 12, wherein the phosphor comprises at least one of a red phosphor, a green phosphor, a blue phosphor, and a white phosphor.

22. The method of manufacturing the light-emitting device according to claim 12, wherein the resin comprises at least one of silicon and epoxy resin.

23. The method of manufacturing the light-emitting device according to claim 12, wherein forming the phosphor layer comprises:
    fixing each of the plurality of phosphor particles in a corresponding one of the plurality of cavities.

24. The method of manufacturing the light-emitting device according to claim 23, wherein fixing each of the plurality of phosphor particles in a corresponding one of the cavities comprises:
    covering the plurality of phosphor particles with the resin.

25. The method of manufacturing the light-emitting device according to claim 23, wherein fixing each of the plurality of phosphor particles in a corresponding one of the plurality of cavities comprises:
    allowing the plurality of phosphor particles in the cavities to harden.

* * * * *